(12) United States Patent
Park et al.

(10) Patent No.: US 7,931,035 B2
(45) Date of Patent: Apr. 26, 2011

(54) METHOD OF AND APPARATUS FOR CLEANING SEMICONDUCTOR WAFERS

(75) Inventors: Ki-Hwan Park, Suwon (KR); Tae-Joon Kim, Suwon (KR); Young-Choul Kook, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 338 days.

(21) Appl. No.: 10/695,770

(22) Filed: Oct. 30, 2003

(65) Prior Publication Data
US 2004/0089325 A1 May 13, 2004

(30) Foreign Application Priority Data

Nov. 11, 2002 (KR) .................. 10-2002-0069630

(51) Int. Cl.
*B08B 3/02* (2006.01)
(52) U.S. Cl. ................... 134/186; 134/198; 134/902
(58) Field of Classification Search .............. 134/198, 134/902, 186
See application file for complete search history.

(56) References Cited

U.S. PATENT DOCUMENTS

| | | | |
|---|---|---|---|
| 5,000,206 A * | 3/1991 | Kramer et al. | 134/34 |
| 5,069,235 A * | 12/1991 | Vetter et al. | 134/113 |
| 5,540,247 A * | 7/1996 | Kawatani et al. | 134/182 |
| 5,885,403 A * | 3/1999 | Cheng | 156/345.15 |
| 6,001,216 A * | 12/1999 | Lee | 156/345.18 |
| 6,006,736 A * | 12/1999 | Suzuki et al. | 125/13.02 |
| 6,109,278 A * | 8/2000 | Shindo et al. | 134/56 R |
| 6,156,153 A * | 12/2000 | Iwamoto et al. | 156/345.21 |
| 6,161,300 A * | 12/2000 | Kim | 34/73 |
| 6,394,110 B2 | 5/2002 | Kamikawa et al. | |
| 6,416,587 B1 * | 7/2002 | Lu et al. | 134/2 |
| 6,637,443 B2 * | 10/2003 | Huh et al. | 134/22.1 |
| 6,883,248 B2 * | 4/2005 | Ko et al. | 34/78 |
| 7,412,981 B2 * | 8/2008 | Egashira et al. | 134/153 |

FOREIGN PATENT DOCUMENTS

| | | | |
|---|---|---|---|
| JP | 09-190992 | * | 7/1997 |
| JP | 10-135175 | * | 5/1998 |
| SU | 1063768 | * | 12/1983 |

* cited by examiner

*Primary Examiner* — Frankie L Stinson
(74) *Attorney, Agent, or Firm* — Volentine & Whitt, PLLC (57) ABSTRACT

A method of and system for cleaning semiconductor wafers minimizes the exposure of the wafers to the air by washing, rinsing and drying the wafers in one cleaning chamber. The system includes a wafer support by which a plurality of wafers can be supported in the cleaning chamber as oriented vertically and spaced from each other, and tubular de-ionized water supply nozzles extending longitudinally in the direction in which the wafers are spaced from each other as disposed to the sides of the wafers. Each de-ionized water supply nozzle has an inner nozzle passageway, and a plurality of sets of nozzle holes extending radially through the main body of the nozzle from the inner nozzle passageway. Each such set of nozzle holes subtends an angle of 80~100° in a vertical plane and is directed towards a surface of a respective wafer W. During a primary rinse procedure, the de-ionized water is supplied to the de-ionized water spray nozzles, and the liquid in the cleaning chamber is simultaneously discharged from a lower part of the chamber and by being allowed to overflow the chamber. The supplying of the de-ionized water to the de-ionized water spray nozzles and the discharging of the cleaning chamber are carried out in proportions that minimize differences in the etching rate of a wafer across the surface thereof.

10 Claims, 6 Drawing Sheets

METHOD OF AND APPARATUS FOR CLEANING SEMICONDUCTOR WAFERS

BACKGROUND OF THE INVENTION

1. Field of the Invention

The present invention relates to the cleaning of semiconductor wafers. More particularly, the present invention relates to a method of and apparatus for washing, rinsing and drying semiconductor wafers all within in one cleaning chamber.

2. Description of the Related Art

Semiconductor devices are generally manufactured by selectively and repetitively performing respective unit processes such as photolithography, etching, ashing, diffusion, chemical vapor deposition, ion implantation and metal deposition processes. These processes, when performed in series, produce at least one or more conductive layers, semiconductor layers and insulator layers on a wafer. Furthermore, each unit process is typically followed by a respective cleaning process for removing impurities from the wafer, e.g., a layer of undesirable material, byproducts of the reaction created during the unit process, or various kinds of foreign substances.

Figure 1:
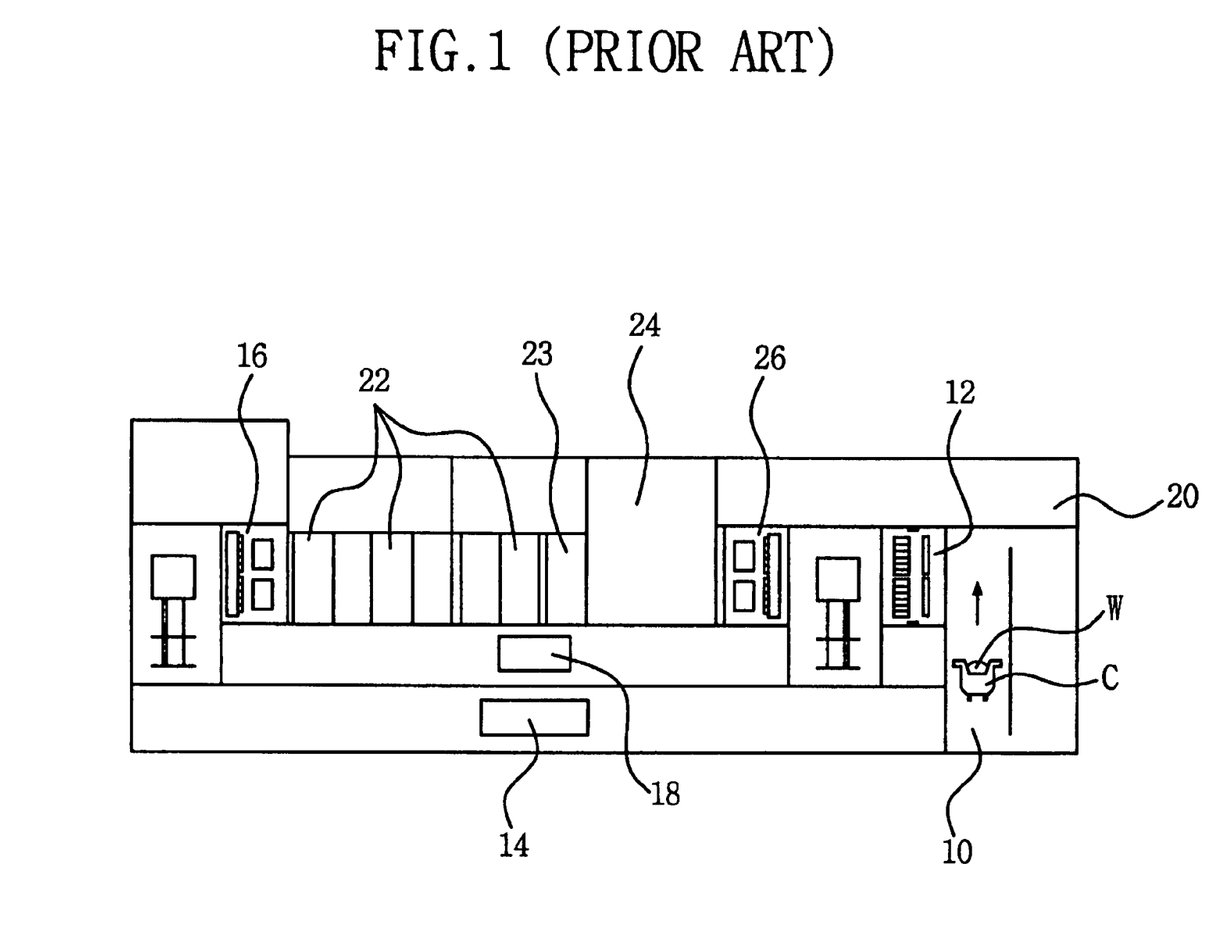
FIG. 1 is a schematic diagram of a conventional semiconductor wafer cleaning system.
Figure 2:
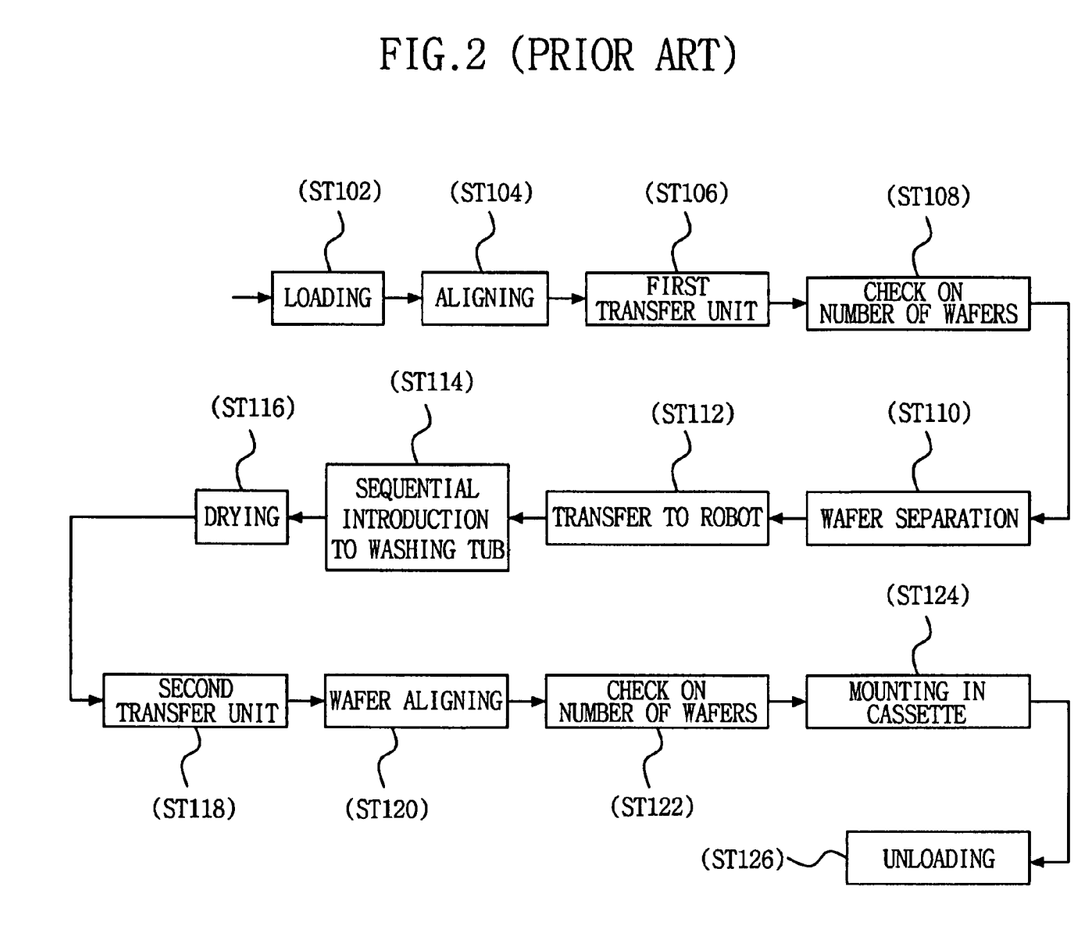
FIG. 2 is a flowchart of the wafer cleaning process performed by the system of FIG. 1.

A prior art semiconductor wafer cleaning system for removing various impurities from a wafer will now be described with reference to FIGS. 1 and 2. A given number of wafers W are mounted in a cassette C after a unit process has been performed on the wafers W. The cassette of wafers W is then transferred by a loading unit 10 to an aligning unit 12 of the cleaning system (ST102). Next, the wafers W are aligned by the aligning unit 12 (ST104) so as to all be oriented in the same direction. The wafers W are next transferred by a transfer device 14 (ST106) to a first transfer unit 16. The first transfer unit 16 checks the number of wafers W in the cassette C (ST108), removes the wafers W from the cassette (ST110), and transfers the wafers W to a robot 18 (ST112).

The wafers W are conveyed by the robot 18 sequentially through a plurality of washing tubs 22 (ST114). At least one first washing tub 22 contains a cleaning solution of an acid or alkaline diluted with de-ionized water for cleaning the wafers W, whereas at least one second washing tub 22 disposed immediately downstream of the first washing tub(s) 22 contains de-ionized water to rinse away any of the chemicals (acid or alkaline) remaining on the surface of the wafers W. The cleaning process that is carried out in each respective washing tub 22 is facilitated by causing the cleaning solution and/or the de-ionized water to overflow the tub 22. Also, the final step of the rinsing procedure is a non-resistance measurement of the impurities.

A drying unit 24 is disposed adjacent to the washing tubs 22 to remove the de-ionized water from the wafer W (ST116). The drying process is performed in an atmosphere of vapors of Isopropyl Alcohol (IPA) to remove moisture from the surface of the wafers W.

The dried wafers W are then transferred to a second transfer unit 26 by the robot 18 (ST118). The second transfer unit 26 aligns the wafers W (ST120) and simultaneously checks whether the same number of wafers W counted by the first transfer unit 16 have been received, i.e., whether all of the wafers have been cleaned (ST122). Furthermore, the second transfer unit 26 mounts the wafers W into a cassette C positioned at a stand-by unit 20 (ST124). Once all of the cleaned and dried wafers W are mounted in the cassette C, the cassette C is unloaded from the cleaning system (ST126).

As is clear from the description above, the components of the prior art cleaning system are disposed in line so that the various steps of the overall cleaning procedure can be carried out in succession. More specifically, the wafers W are transferred from a washing tub(s) 22 containing chemicals to a washing tub 22 containing only de-ionized water (for a primary rinse), and then again to another washing tub 22 containing de-ionized water (for a secondary rinse). The rinsed wafers W are then moved from the last washing tub 22 to the drying unit 24.

The wafers W are thus exposed to the air for a considerable period time while the wafers W are being moved to the drying unit 24. The exposure of the wafers W allows oxygen $O_2$ in the air to dissolve into moisture on the wafer surface. Spots of SiOx are then formed on the wafer surface because the oxygen $O_2$ reacts with the poly Si of the wafer and then dries naturally. These spots remain as they are as inorganic matter of the silica group or adsorb various other foreign substances in the air. These so-called water spots can produce contact defects.

Furthermore, the various chemicals or de-ionized water in which the wafers W are submerged are kept flowing from a lower part to an upper part of the washing tub 22 (overflow cleaning method). Thus, a difference in the etching rate of the wafers occurs, as between the lower and upper portions of the wafers 22 in the tubs 22.

Figure 3:
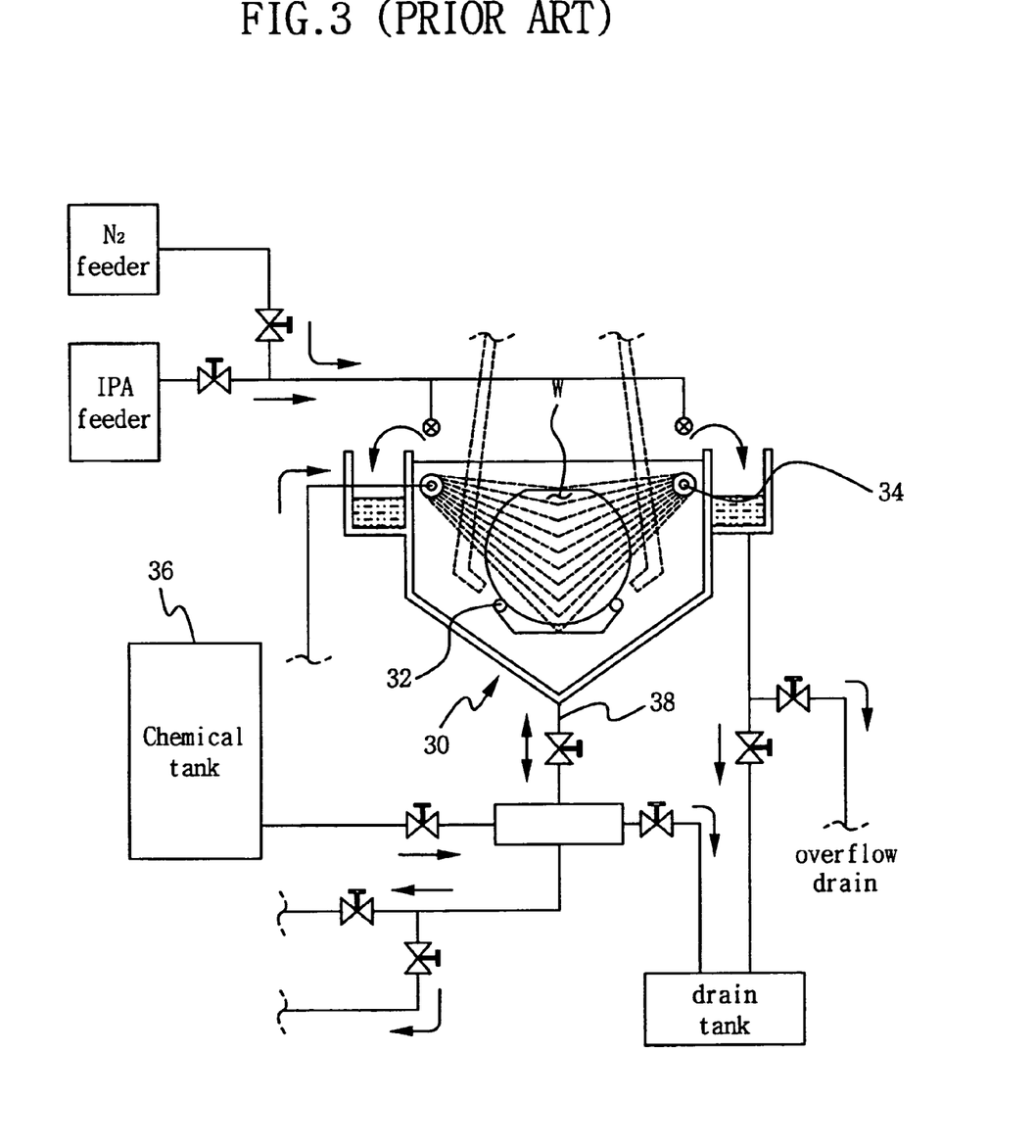
FIG. 3 is a schematic diagram of a conventional wafer cleaning apparatus.

FIG. 3 illustrates a conventional wafer cleaning apparatus aimed at obviating the problems described above in connection with the system of FIG. 1. In this apparatus, a plurality of wafers W are separated from the cassette C and stand by, a cleaning chamber 30 is filled with a cleaning solution comprising chemicals diluted with the de-ionized water, and the wafers W are submerged in the cleaning solution. After a given time elapses, i.e., once enough time has been given for the cleaning solution to clean the wafers W, the cleaning solution is discharged from the cleaning chamber 30 while de-ionized water is supplied into the chamber 30. Thus, the wafers W are rinsed in the same chamber 30. Next, the de-ionized water is drained from the chamber 30 while the chamber 30 is filled with IPA vapor, thereby drying the wafers. Subsequently, heated $N_2$ gas is introduced into the cleaning chamber 30 while the IPA vapors are discharged.

Such a cleaning system washes, rinses and dries the wafers W all within in one chamber 30 to minimize the exposure of the wafers W to the air during the overall cleaning process. However, this process requires much more time than the process of FIG. 2 based on an in-line disposition of washing tubs 22.

SUMMARY OF THE INVENTION

An object of the present invention is to provide a semiconductor wafer cleaning system and method in which washing, rinsing and drying operations are carried out in one cleaning chamber and yet, very few water spots or other particle defects are caused.

Another object of the present invention is to provide a semiconductor wafer cleaning system and method in which washing, rinsing and drying operations are carried out in one cleaning chamber, and yet the etching rate is uniform across the surface of the wafer.

According to one aspect of the present invention, a semiconductor wafer cleaning system comprises a cleaning chamber that can accommodate a plurality of wafers as spaced from one another in a first direction, a cleaning solution by which the cleaning chamber can be filled with cleaning solution, a discharge section by which liquid in the cleaning chamber can be discharged, and de-ionized water supply nozzles for spraying deionized water into the cleaning chamber towards the wafers, wherein each of the de-ionized water supply nozzles has a main body in the form of a pipe defining an inner nozzle passageway, and a plurality of sets of nozzle holes connected to the inner nozzle passageway, each set of said nozzle holes subtending an angle of 80~100° about the inner nozzle passageway from which the set of nozzle holes extends so that the de-ionized water is sprayed through each set of nozzle holes over a range of 80~100° as measured in the circumferential direction of the main body of the nozzle.

The discharge section includes at least one discharge pipe connected to a lower part of said cleaning chamber, and an overflow tank surrounding an upper part of said cleaning chamber. Also, a control means controls the rate at which the de-ionized water is sprayed in to the cleaning chamber, and the rates at which the liquid is discharged from the he cleaning chamber via the discharge pipe and overflow tank.

Preferably, each set of nozzle holes consists of five nozzle holes disposed at equal angular intervals relative to each other, and centered relative to the centers of vertically oriented wafers. Furthermore, the inner nozzle passageway preferably has a diameter (inner diameter of the pipe) of 0.8±0.05 mm, whereas the nozzle holes preferably each have a diameter of ~0.5±0.05 mm.

According to another aspect of the present invention, a method of cleaning semiconductor wafers comprises washing a plurality of wafers by submerging the wafers in cleaning solution within a cleaning chamber with the wafers being oriented vertically and spaced from each other in a first direction, subsequently rinsing the vertically oriented wafers within the cleaning chamber by spraying de-ionized water onto the surfaces of the wafers within the chamber using de-ionized water spray nozzles, simultaneously discharging liquid from the cleaning chamber by draining the liquid from a lower part of the cleaning chamber, and allowing the liquid to overflows the cleaning chamber, and controlling the supply of the de-ionized water to the de-ionized water to the deionized water spray nozzles and the discharging of the liquid such that liquid in an amount of 92-97 weight % of the de-ionized water that is being supplied by the nozzles into the cleaning chamber is simultaneously discharged from the cleaning chamber through the lower part of the cleaning chamber, while only liquid in an amount of 3-8 weight % of the de-ionized water that is being supplied by the nozzles is simultaneously discharged as overflowing the cleaning chamber.

BRIEF DESCRIPTION OF THE DRAWINGS

These and other objects, features and advantages of the present invention will become more fully understood from the detailed description given hereinbelow and the accompanying drawings, wherein.

DETAILED DESCRIPTION OF THE PREFERRED EMBODIMENTS

A semiconductor wafer cleaning system and method according to the present invention will be described with reference to FIGS. 4 through 6.

Figure 4:
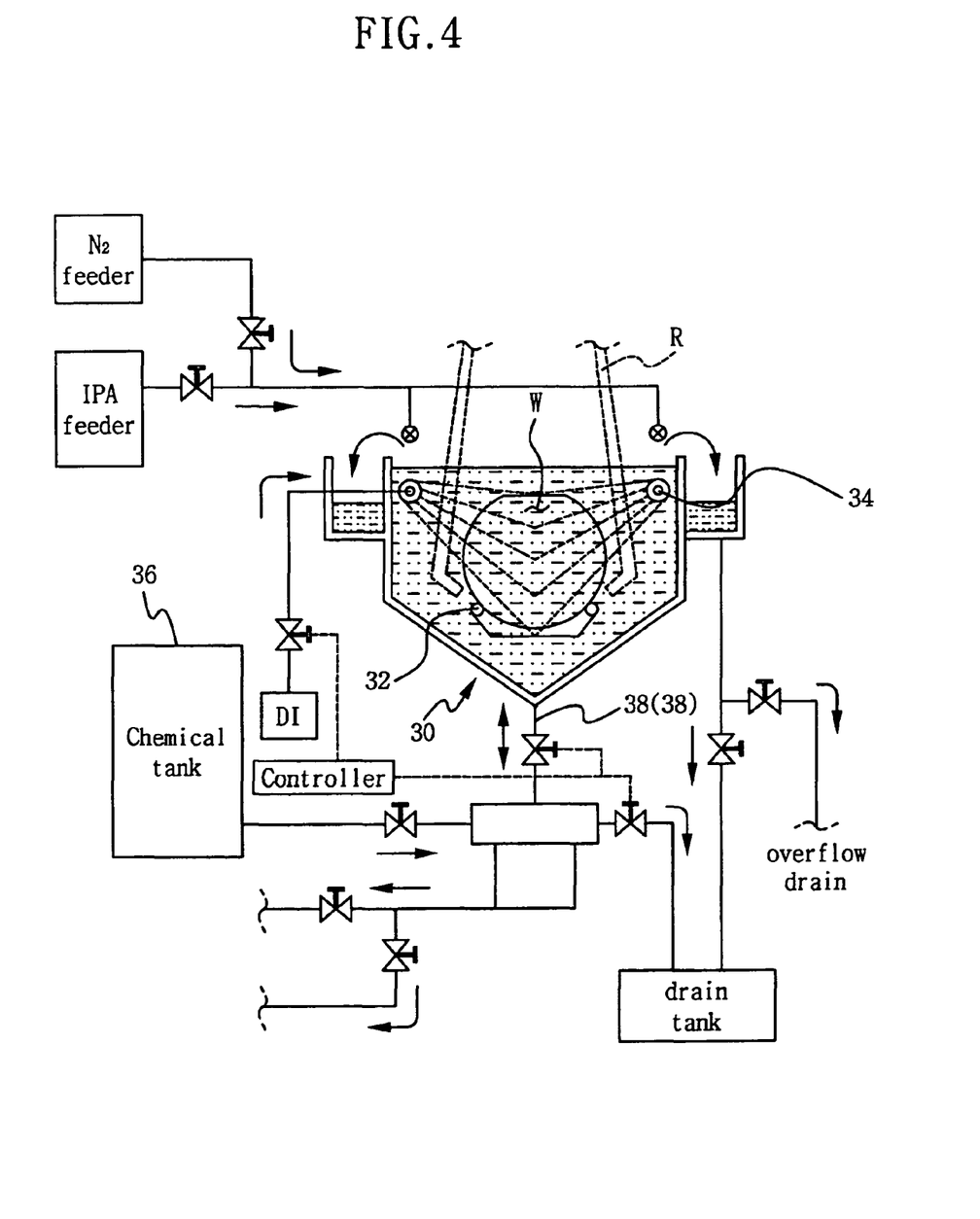
FIG. 4 is a schematic diagram of a semiconductor wafer cleaning system according to the present invention.

Referring first to FIG. 4, a semiconductor wafer cleaning system includes a cleaning chamber 30 in which cleaning, rinse and drying operations are performed, an overflow tank disposed around the top of the cleaning chamber 30, a wafer support member 32 disposed at the bottom of the chamber 30 for supporting the wafers W in the chamber 30 as oriented vertically and spaced apart from each other, and a de-ionized water supply nozzle 34 for supplying de-ionized water into the chamber 30. The cleaning chamber 30 has such a capacity that 25 wafers W can be freely loaded into the chamber 30 and taken out of the chamber by a robot, and can be submerged in cleaning solution that fills the cleaning chamber 30. However, the present invention is not limited to having a capacity that accommodates 25 wafers W.

In operation, first a plurality of wafers W are removed from a cassette and stand by adjacent the cleaning apparatus. Then a controller (not shown) issues a command to fill the cleaning chamber 30 with a cleaning solution via a pipe 38 connected to a lower part of the cleaning chamber 30. The cleaning solution is provided by diluting an alkali or acid, stored in a chemical tank 36, with de-ionized water at a predetermined amount. Once the cleaning solution fills the cleaning chamber 30, a controller commands a robot R to load the wafers W in the stand-by state into the chamber 30 and onto the wafer support member 32. Thus, the wafers W are submerged in the cleaning solution within the cleaning chamber 30, and are left that way for a predetermined period of time so as to be cleaned by the cleaning solution.

Next, the controller initiates a primary rinse procedure in which the de-ionized water is supplied to each of the wafers W through the de-ionized supply nozzle 34. Various parameters, under which the de-ionized water is supplied to each of the wafers W and is discharged during the rinse procedure, were determined through experiments conducted by the present inventors, as summarized below in Table 1.

Figure 6:
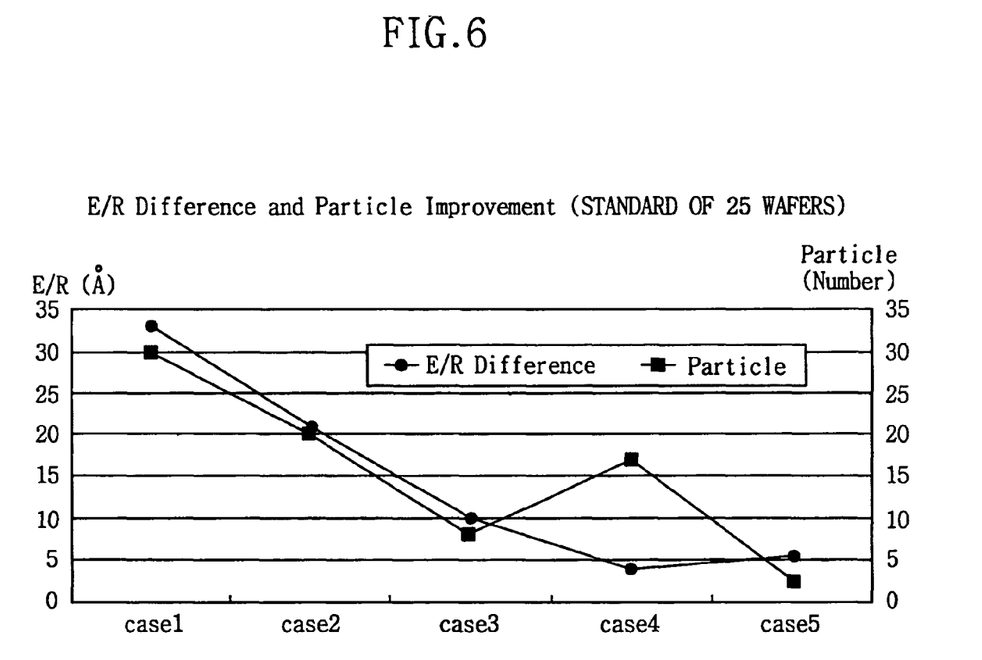
FIG. 6 is a graph illustrating etching rate (E/R) differences, and particles or defect on a wafer, in connection with each of several embodiments of the semiconductor wafer cleaning apparatus according to the present invention.

The results provided by these embodiments are shown in the graph of FIG. 6

TABLE 1

| | Supply rate of de-ionized water (A) | Diameter of inner nozzle (B) | Diameter of outer nozzle (C) | Supply angle of de-ionized water (D) | Wastewater discharge rate during de-ionized water supply procedure (E) | Number of discharge pipes (F) |
|---|---|---|---|---|---|---|
| 1 | 36 l/min | 1.8~2.3 φ | 0.8 ± 0.05 Φ 12 holes | 90° | pipe 70: overflow 30 | 1 |
| 2 | 36 l/min | 1.0 ± 0.1 φ | 0.8 ± 0.05 Φ 12 holes | 90° | pipe 80: overflow 20 | 2 |
| 3 | 30 l/min | 0.8 ± 0.05 φ | 0.5 ± 0.05 Φ 5 holes | 90° | pipe 90: overflow 10 | 2 |
| 4 | 19 l/in | 0.8 ± 0.05 φ | 0.5 ± 0.05 Φ 6 holes | 95° | pipe 95: overflow 05 | 2 |
| 5 | 24 l/min | 0.8 ± 0.05 φ | 0.5 ± 0.05 Φ 5 holes | 90° | pipe 95: overflow 05 | 2 |

Figure 5:
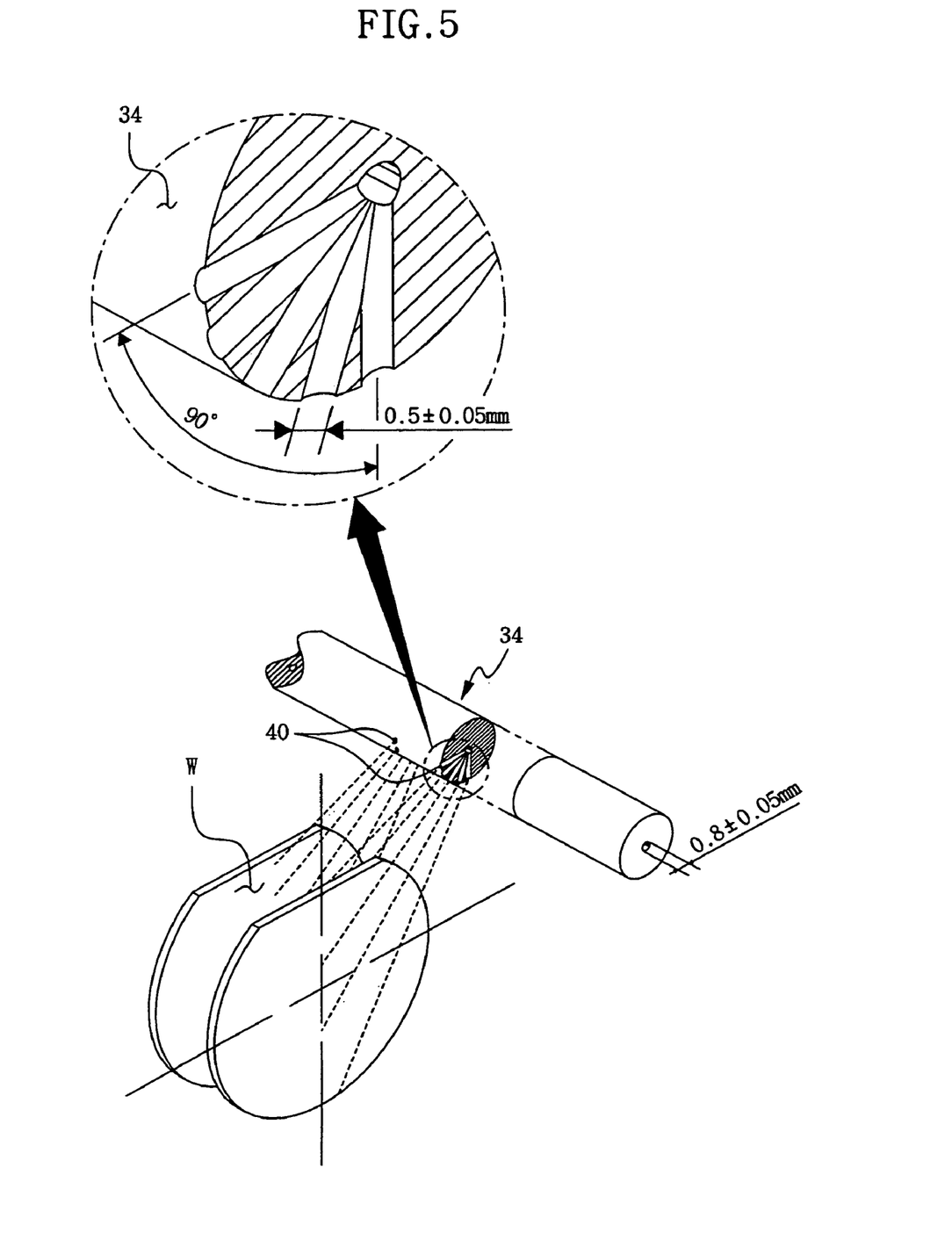
FIG. 5 is a partial sectional view of a de-ionized water supply nozzle of the semiconductor wafer cleaning apparatus according to the present invention.

As shown in FIGS. 4 and 5, each de-ionized water supply nozzle 34 comprises a pipe that extends longitudinally in the direction in which the wafers W are arrayed (spaced), and is connected to a de-ionized water supply line. Each nozzle 34 has a main nozzle passageway, namely the longitudinally extending opening of the pipe that has a diameter corresponding to the inner diameter of the nozzle 34, and a plurality of sets of nozzle openings 40 spaced from each other along the length of the nozzle in correspondence with the wafers W. Each of the nozzle holes 40 extends radially through the pipe from the main nozzle passageway.

In a first embodiment (case 1 of FIG. 6), the inner diameter (parameter B) of each de-ionized water supply nozzle 34 was 1.8~2.3 mm, each nozzle 34 included twelve (12) sets of nozzle holes 40, and the diameter of each of the nozzle holes was ~0.8±0.005 mm (parameter C). Furthermore, each set of nozzles holes 40 subtended an angle (parameter D) of 90° from the axial center of the nozzle 34 such that the deionized water issuing from each set of nozzle holes 40 is sprayed in at an angle of 90° from the nozzle 34.

Also, during the rinsing procedure, the deionized water in the chamber 30 is discharged from the cleaning chamber 30 in a weight % ratio (parameter E)=E1:E2, wherein E1+E2 equals the weight (100%) of the water that is being fed through the nozzles 34, E1 is the weight % of the liquid that is discharged from the bottom of the cleaning chamber 30, and E2 is the weight % of the liquid that is discharged as overflowing the chamber 30. In the first embodiment, liquid in an amount of about 70 weight % (E1) of the de-ionized water that is being supplied by the nozzles 34 is discharged from the cleaning chamber 30 through the bottom of the cleaning chamber 30, while liquid in an amount of about 30 weight % (E2) of the de-ionized water that is being supplied by the nozzles 34 is discharged as overflowing the chamber 30.

Also, in this embodiment, the apparatus is provided with only one discharge pipe (parameter F) connected to the bottom of the cleaning chamber 30 and through which the deionized water is drained from the chamber 30 during the rinsing procedure. Still further, the deionized water is supplied through the nozzles 34 at a supply rate (parameter A) of 36l/min.

This embodiment, as shown in the graph of FIG. 6, produces a remarkably smaller E/R difference (difference in etching rates at upper and lower portions of the vertically oriented wafers in the chamber 30), and yields wafers having fewer particle defects, as compared with the results of the conventional cleaning system comprising an in-line array of washing tubs.

The second embodiment of the invention (case 2) was identical to the first embodiment in terms of the parameters A, C and D. However, the inner diameter (parameter B) of each de-ionized water supply nozzle 34 was 1.0±0.1 mm, and the weight % ratio (E=E1:E2) was 80 weight %: 20 weight %. Also, this embodiment included two discharge pipes (parameter F) for discharging the de-ionized water from the bottom of the chamber 30. the second discharge pipe is represented in FIG. 4 by the second reference numeral (38).

The third embodiment (case 3) had the same parameters D and F as the second embodiment. However, the supply rate (parameter A) was set at 30l/min, the inner diameter (parameter B) of each de-ionized water supply nozzle 34 was 0.8±0.05 mm, the diameter of each of the nozzle holes (parameter C) was 0.5±0.05 mm, and the deionized water in the chamber 30 was discharged from the cleaning chamber 30 in a weight % ratio (parameter E)=E1:E2 of 90 weight %: 10 weight %. As the graph of FIG. 6 clearly chows, the third embodiment produced a remarkably lower etching rate difference and fewer particle defects in comparison with the second embodiment.

The fourth embodiment of the invention (case 4) had the same parameters B, C and F as the third embodiment. However, the supply rate (parameter A) was set at 19l/min, each set of nozzles holes 40 sprayed the de-ionized water at an angle (parameter D) of 95°, and E-1 in the condition E has a weight ratio 95(%) and the deionized water in the chamber 30 was discharged from the cleaning chamber 30 in a weight % ratio (parameter E) =E1:E2 of 95 weight %: 5 weight%. Although this embodiment produces uniformity in the etching rates from the upper to the lower parts of the vertically oriented wafers W, it allows for more particle defects than the third embodiment.

The fifth embodiment of the present invention had the same parameters B, C, E, F of the fourth embodiment. However, the supply rate (parameter A) was set at 24l/min, and the de-ionized water was sprayed at an angle of 90° (parameter D) onto the wafers W. The fifth embodiment yielded similar results, in terms of etching rate difference, to the fourth embodiment but yielded a remarkably fewer number of particle defects.

As described above, according to an exemplary embodiment of the present invention, the tubular de-ionized water supply nozzles 34 extend longitudinally in the direction in which the wafers are spaced from each other, and to the sides of the wafers W within the cleaning chamber 30. Each de-ionized water supply nozzle 34 has an inner nozzle passageway, and a plurality of sets of five nozzle holes 40 extending radially through the main body of the nozzle from the inner nozzle passageway. Each such set of nozzle holes 40 subtends an angle of 80~100° in a vertical plane and is directed towards a surface of a respective wafer W. The inner nozzle passageway of each de-ionized water supply nozzle 34 has a diameter of 0.8±0.05 mm, whereas the nozzle holes 40 each have a diameter of 0.5±0.05 mm.

A control means, e.g., controller and valves, regulates the amount of the de-ionized water sprayed into the chamber through the de-ionized water nozzles 34 to 21~26l/min. The control means also controls the discharging of the liquid from the cleaning chamber such liquid in an amount of 92-97 weight% of the de-ionized water that is being supplied by the nozzles 34 into the cleaning chamber 30 is simultaneously discharged from the cleaning chamber 30 through the lower part of the cleaning chamber 30, while liquid in an amount of 3-8 weight% of the de-ionized water that is being supplied by the nozzles 34 is simultaneously discharged as overflowing the cleaning chamber 30. The discharging of the liquid from the lower part of the leaning chamber 30 takes place at least two locations aligned in the direction in which the wafers W are spaced from each other on the support 32 in the chamber 30 so that the draining of the cleaning chamber 30 effects the wafers W more uniformly.

This primary rinse procedure is carried out for a given period of time, i.e., until the concentration of the cleaning solution in the cleaning chamber 30 becomes low. A secondary rinse procedure is performed after this primary rinse procedure. In this secondary rinse procedure, the de-ionized water continues to be supplied through the de-ionized supply nozzles 34 while the liquid is discharged through the lower part of the cleaning chamber 30 at a higher rate. Accordingly, the spraying of the de-ionized water prevents the wafers W from being exposed to the air as the level of the liquid in the cleaning chamber 30 drops below that of the wafers W in the cleaning chamber 30. Also, once the wafers W become disposed above the surface of the liquid in the cleaning chamber 30, isopropyl alcohol (IPA) vapors are introduced into the cleaning chamber 30 and the de-ionized water continues to be supplied. The supplying of the de-ionized water is terminated after a predetermined period of time, thereby completing the secondary rinse procedure, whereupon a drying procedure begins.

Although the present invention has been described above in connection with certain preferred embodiments thereof, various changes to these embodiments will be apparent to those skilled in the art. Therefore, all such modifications and variations of the disclosed embodiments are sent o be within the true spirit and scope of the invention as defined by the appended claims.

What is claimed is:

1. A semiconductor wafer cleaning system, comprising:
   a cleaning chamber;
   a wafer support disposed within said chamber and configured to support a plurality of wafers within said chamber as spaced from one another in a first direction;
   a source of cleaning solution associated with said cleaning chamber such that said cleaning chamber can be filled with cleaning solution from said source;
   a source of de-ionized water;
   de-ionized water supply nozzles, and piping connecting said de-ionized water supply nozzles to said source of de-ionized water,
   each of the de-ionized water supply nozzles having a main body in the form of a pipe defining an inner nozzle passageway, and a plurality of sets of nozzle holes extending from the inner nozzle passageway, the main bodies of said de-ionized water supply nozzles extending longitudinally in said first direction at opposites sides of said wafer support, the nozzle holes of each said set lying in a plane that intersects said first direction, only five respective ones of said nozzle holes lying in each said plane, and said sets of nozzle holes being spaced from each other along the length of the main body, and
   each said set of five nozzle holes subtending an angle of 80~100° about the inner nozzle passageway from which the set of nozzle holes extends, and each of said nozzles holes being oriented to spray deionized water from said source thereof towards wafers supported by said wafer support in the chamber so that the de-ionized water is sprayed through each said set of nozzle holes over a range of 80~100°, as measured in the circumferential direction of the main body of the nozzle, towards wafers supported by said wafer support in the chamber;
   a discharge section including at least one discharge pipe connected to a lower part of said cleaning chamber, and an overflow tank surrounding an upper part of said cleaning chamber; and
   control means for controlling the rates at which de-ionized water is fed through said de-ionized water supply nozzles and at which fluid in said chamber is discharged via said discharge section.

2. The system of claim 1, wherein the inner nozzle passageway of each said de-ionized water supply nozzle has a diameter thereof of 0.8±0.05 mm, and the nozzle holes each have a diameter of 0.5~±0.05 mm.

3. The system of claim 1, wherein the discharge section includes at least two discharge pipes connected to a lower part of said cleaning chamber at locations spaced from one another in said first direction.

4. The system of claim 1, having only two said deionized water nozzles, and wherein the deionized water nozzles are disposed at opposite sides, respectively, of an upper portion of the cleaning chamber, the nozzle holes extend from the inner nozzle passageways of the deionized water nozzles with a downward inclination toward vertical lines which bisect the wafer support at locations, respectively, where the wafer support is configured to support the wafers in the chamber such that deionized water issues from each of the nozzle holes as a stream flowing with a downward inclination towards a wafer supported by said wafer support in the chamber.

5. The system of claim 4, wherein said controller is configured to control the supplying of the de-ionized water to said cleaning chamber via the de-ionized water supply nozzles and to control the discharging of liquid via the at least one discharge pipe such that liquid in an amount of 92-97 weight % of the de-ionized water that is being supplied by the nozzles into the cleaning chamber is simultaneously discharged from the cleaning chamber, while liquid in an amount of 3-8 weight % of the de-ionized water that is being supplied by the nozzles is simultaneously discharged as overflowing the cleaning chamber.

6. The system of claim 1, wherein said controller is configured to control the supplying of the de-ionized water to said cleaning chamber via the de-ionized water supply nozzles and to control the discharging of liquid via the at least one discharge pipe such that liquid in an amount of 92-97 weight % of the de-ionized water that is being supplied by the nozzles into the cleaning chamber is simultaneously discharged from the cleaning chamber, while liquid in an amount of 3-8 weight % of the de-ionized water that is being supplied by the nozzles is simultaneously discharged as overflowing the cleaning chamber.

7. The system as claimed in claim 1, wherein the source of cleaning solution is connected to the cleaning chamber via the at least one discharge pipe.

8. A semiconductor wafer cleaning system, comprising:
   a cleaning chamber;
   a wafer support disposed within said chamber and configured to support a plurality of wafers within said chamber as spaced from one another in a first direction;
   a source of cleaning solution associated with said cleaning chamber such that said cleaning chamber can be filled with cleaning solution from said source;
   a source of de-ionized water;
   de-ionized water supply nozzles, and piping connecting said deionized water supply nozzles to said source of de-ionized water,
   each of the de-ionized water supply nozzles having a main body in the form of a pipe defining an inner nozzle passageway, and a plurality of sets of nozzle holes extending from the inner nozzle passageway, the main bodies of said de-ionized water supply nozzles extending longitudinally in said first direction at opposites sides of said wafer support, the nozzle holes of each said set lying in a plane that intersects said first direction, and said sets of nozzle holes being spaced from each other along the length of the main body, and
   each said set of said nozzle holes subtending an angle of 80~100° about the inner nozzle passageway from which the set of nozzle holes extends, and each of said nozzles holes being oriented to spray deionized water from said source thereof towards wafers supported by said wafer support in the chamber so that the de-ionized water is sprayed through each said set of nozzle holes over a range of 80~100°, as measured in the circumferential direction of the main body of the nozzle, towards wafers supported by said wafer support in the chamber;

a discharge section including at least one discharge pipe connected to a lower part of said cleaning chamber, and an overflow tank surrounding an upper part of said cleaning chamber; and control means operatively connected to the de-ionized water supply nozzles and to the discharge section and configured to control the supplying of the de-ionized water to said cleaning chamber via the de-ionized water supply nozzles and to control the discharging of liquid via the at least one discharge pipe such that liquid in an amount of 92-97 weight % of the de-ionized water that is being supplied by the nozzles into the cleaning chamber is simultaneously discharged from the cleaning chamber, while liquid in an amount of 3-8 weight % of the de-ionized water that is being supplied by the nozzles is simultaneously discharged as overflowing the cleaning chamber.

9. The system of claim 8, having only two said deionized water nozzles, and wherein the deionized water nozzles are disposed at opposite sides, respectively, of an upper portion of the cleaning chamber, the nozzle holes extend from the inner nozzle passageways of the deionized water nozzles with a downward inclination toward vertical lines which bisect the wafer support at locations, respectively, where the wafer support is configured to support the wafers in the chamber such that deionized water issues from each of the nozzle holes as a stream flowing with a downward inclination towards a wafer supported by said wafer support in the chamber.

10. The system as claimed in claim 8, wherein the source of cleaning solution is connected to the cleaning chamber via the at least one discharge pipe.

* * * * *